United States Patent [19]

Crill et al.

[11] Patent Number: 4,710,733
[45] Date of Patent: Dec. 1, 1987

[54] R.F. PHASE MODULATOR

[75] Inventors: Philip D. Crill, Los Altos; Michael D. Rubin, Saratoga, both of Calif.

[73] Assignee: Ford Aerospace & Communications Corporation, Detroit, Mich.

[21] Appl. No.: 923,989

[22] Filed: Oct. 28, 1986

[51] Int. Cl.⁴ .............................................. H01P 1/32
[52] U.S. Cl. ........................................ 332/26; 333/1.1
[58] Field of Search ...................... 332/16 R, 26, 68; 333/1.1; 375/61, 67

[56] References Cited

U.S. PATENT DOCUMENTS 3,136,950 6/1964 Mackey .
3,267,395 8/1966 Keeling et al. .
3,274,521 9/1966 Nourse .
3,398,383 8/1968 Jones et al. .
3,437,957 4/1969 Ames .
3,739,301 6/1973 Garver .
3,868,602 2/1975 Meddaugh .................... 333/1.1 X
4,507,629 3/1985 Frank .

Primary Examiner—Eugene R. LaRoche
Assistant Examiner—Robert J. Pascal
Attorney, Agent, or Firm—Edward J. Radlo; Keith L. Zerschling

[57] ABSTRACT

An r.f. phase modulator operable at up to extremely high frequencies. A circulator (1) having input, output, and isolated ports (2, 3, 4, respectively), channels an r.f. carrier (15) in a prescribed direction. Fitting into an open end of the output port (3) is a moving reflective surface (6) coupled via a moving plunger (7) fixedly mounted at one end thereof to a housing (5) fixedly mounted with respect to the circulator (1). A modulating signal (9) is applied to the plunger (7), causing the reflective surface (6) to move linearly within the output port (3). This change in path length of the carrier (15) produces linear phase modulation thereon. The plunger (7) can comprise a magnetostrictive material (7A), a piezoelectric material (7B), a thermally expansive material (7C), or a combination thereof. The invention can be used for temperature compensation and phase stabilization as well as phase modulation.

10 Claims, 3 Drawing Figures

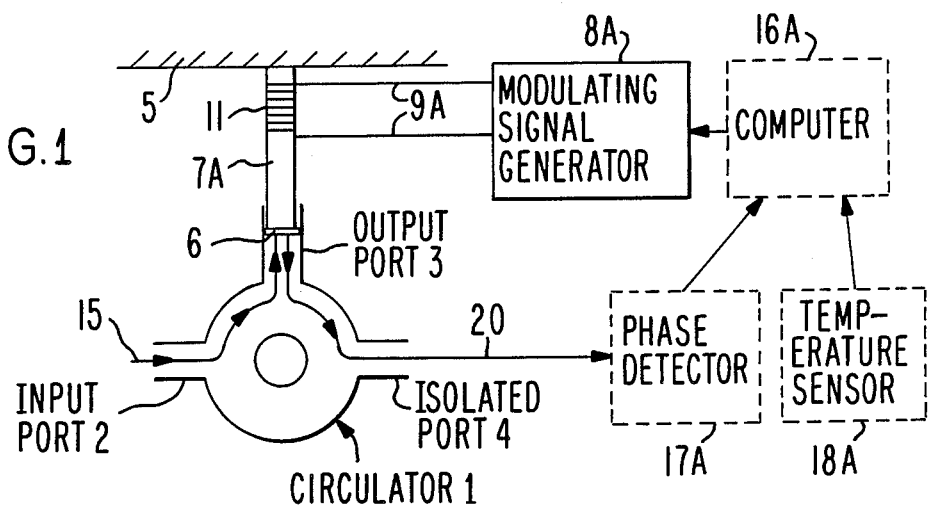
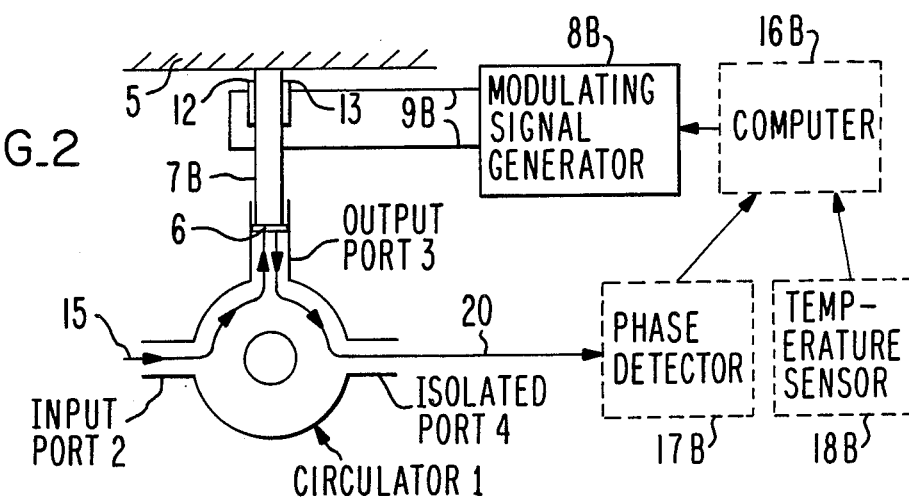
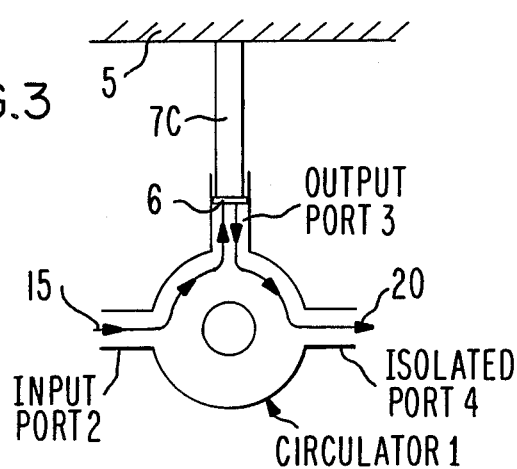

R.F. PHASE MODULATOR

DESCRIPTION

1. Technical Field

This invention pertains to the field of phase modulating a radio frequency (r.f.) electromagnetic sinusoidal carrier.

2. Background Art

The conventional manner of producing phase modulation is to phase modulate a low frequency carrier, then multiply or heterodyne the carrier to get to a high frequency. The present invention modulates the phase of a c.w. carrier directly at high frequency, eliminating the distortions associated with the multiplying or heterodyning process.

U.S. Pat. No. 3,398,383 describes a microwave modulator which uses anisotropic effects of ferromagnetic resonance in piezoelectric crystals. The reference device differs from that of the instant invention in that: (1) it operates on a traveling wave, not on a standing wave; (2) it is narrow banded because it operates only at ferromagnetic resonant frequencies; (3) it apparently produces both phase and amplitude modulation, whereas the present invention produces just phase modulation; and (4) the device uses torsional motion to produce the modulation, whereas the instant invention uses linear motion.

U.S. Pat. No. 4,507,629 discloses a microwave phase shifter comprising a three-port circulator having a pin diode switchable short circuit across one of the ports, which changes the electrical length of the circulator, thereby controlling the phase of the output signal. The reference device differs from the present invention in that: (1) only discrete, rather than analog, phase shifts can be accomplished; and (2) the device cannot operate at as high frequencies as those of the present invention.

Secondary references are U.S. Pat. Nos. 3,136,950; 3,267,395; 3,274,521; 3,437,957; and 3,739,301.

DISCLOSURE OF INVENTION

The present invention is an r.f. phase modulator wherein the r.f. carrier (15) to be modulated is made to flow through a circulator (1) having input (2), output (3), and isolated (4) ports. The output port (3) terminates in a moving reflective surface (6) coupled to a moving plunger (7). The plunger (7) is attached at one end thereof to a housing (5) fixedly mounted with respect to the circulator (1). A modulating signal (9A, 9B) is applied to the plunger (7). The position of the reflective surface (6) within the output port (3) is a linear function of the amplitude of the modulating signal (9A, 9B). The movement of the reflective surface (6) changes the path length of the r.f. carrier (15), producing linear phase modulation thereon.

BRIEF DESCRIPTION OF THE DRAWINGS

These and other more detailed and specific objects and features of the present invention are more fully disclosed in the following specification, reference being had to the accompanying drawings, in which:

FIG. 1 is a side cross-sectional sketch, partly in the form of a functional block diagram, of a first embodiment of the present invention, in which plunger 7A comprises a magnetostrictive material;

FIG. 2 is a wide cross-sectional sketch, partly in the form of a functional block diagram, of a second embodiment of the present invention, in which plunger 7B comprises a piezoelectric material; and FIG. 3 is a side cross-sectional sketch of a third embodiment of the present invention, in which plunger 7C comprises a thermally expansive material.

BEST MODE FOR CARRYING OUT THE INVENTION

The present invention can be used at any radio frequency, although it finds its greatest applicability at extremely high frequencies, such as 60 GHz.

In the FIG. 1 embodiment, plunger 7A comprises a magnetostrictive material, that is, a material which shrinks or expands under the presence of a magnetic field. Ferrite, iron, nickel, cobalt, and nickel/cobalt alloys are examples of suitable magnetostrictive materials. In this case, the modulating magnetic field is produced by an alternating current modulating signal 9A, provided by modulating signal generator 8A. Signal 9A is conveyed via coil 11 wrapped around plunger 7A, and can be biased at a fixed d.c. level. One end of plunger 7A is fixedly coupled to housing 5, which is in spatially fixed relation to circulator 1, e.g., they are mounted on a common chassis. The other end of plunger 7A is free to expand and contract within an open end of output port 3 of circulator 1. Attached to this second end of plunger 7A is a highly reflective surface 6, e.g., a diaphragm fabricated of a conductor or a high dielectric constant material. Alternatively, diaphragm 6 can be integral with plunger 7. A tight fit is formed between diaphragm 6 and the open end of port 3 in order to avoid electromagnetic leakage.

R.f. carrier 15 enters input port 2 of circulator 1, and travels in the direction governed by the construction of circulator 1 past an interior opening of output port 3, where carrier 15 enters port 3, is reflected off diaphragm 6, re-enters the circulating portion of circulator 1, and exits isolated port 4 as modulated signal 20.

The phase of modulated signal 20 is a linear function of the displacement of plunger 7A within port 3. Since the displacement of plunger 7A within port 3 is a linear function of the amplitude of driving signal 9A, independent of the frequency of driving signal 9A (thus constituting a true phase modulator), the modulation can be said to be linear. Plunger excursions of a quarter wavelength in either direction can provide total modulation of $\pm \pi/2$.

The FIG. 2 embodiment is identical to that of FIG. 1, except that plunger 7B is fabricated of a piezoelectric material, rather than a magnetostrictive material. An example of a suitable piezoelectric material for plunger 7B is quartz, which can accommodate high modulating frequencies (on the order of 100 MHz). In this case, the a.c. driving signal 9B is applied by modulating signal generator 8B via electrodes 12 and 13 sandwiched around plunger 7B in such manner as to cause a linear displacement of plunger 7B within port 3 as a linear function of the amplitude of the driving signal 9B, independent of the frequency of driving signal 9B. Again, the phase shift within r.f. carrier 15 is a linear function of the linear displacement of plunger 7B within port 3, and hence a linear function of driving signal 9B.

The piezoelectric embodiment illustrated in FIG. 2 typically produces less plunger 7 movement than the magnetostrictive embodiment illustrated in FIG. 1, and therefore, it is suitable for extremely high frequencies, such as those in excess of 100 GHz. The modulating frequency can also be higher, due to the ease of driving a capacitive, as opposed to an inductive, load.

In the embodiment illustrated in FIG. 3, plunger 7C is fabricated of a thermally expansive material, and the "modulating signal" is a change in the ambient temperature. This embodiment finds its greatest applicability in the field of temperature compensation. The change in temperature causes a change in the path length of the microwave signal 15 flowing through circulator 1. The linear position of plunger 7C is made to change an amount necessary and sufficient to compensate for this change in path length.

A given change in the linear displacement of plunger 7C and reflective surface 6 has a doubling effect on the phase of the signal 15 within circulator 1, because signal 15 goes up and down within port 3. This can be written as:

$$\Delta L(c) = 2\Delta L(p)$$

where $\Delta L(c)$ is the change in the length of that portion of equipment (circulator 1 and perhaps some associated equipment) which needs to be compensated due to temperature changes therein causing an undesired phase shift in carrier 16. $L(p)$ is the change in the length of plunger 7C.

Substituting the definition of a thermal expansion coefficient into the above equation, we get:

$$TEC(c)L(c)\Delta T = 2TEC(p)L(p)\Delta T$$

where
$TEC(c)$ is the thermal expansion coefficient in that portion of equipment that needs to be temperature compensated;
$L(c)$ is the length of the path in that portion of equipment that needs to be temperature compensated; $\Delta T$ is the change in temperature;
$TEC(p)$ is the thermal expansion coefficient of plunger 7C; and
$L(p)$ is the length of plunger 7C.
Rearranging the above equation, we get:

$$TEC(p) = TEC(c)L(c)/2L(p).$$

$L(c)$ is preselected and $TEC(c)$ is known from the materials comprising the preselected path.

Thus, for a given plunger 7C length, the TEC of plunger 7C can be selected to effect a compensation of the temperature-induced phase shift, by selecting a material having that TEC. Alternatively, for a given material (and hence TEC), the length of plunger 7C can be selected to give the desired compensation.

The embodiments illustrated in FIGS. 1 and 2 can also be used for temperature compensation, by causing modulating signal generators 8 to generate modulating signals 9 having amplitudes calculated to produce a $\Delta L(p)$ of $\Delta L(c)/2$. In this case, $\Delta L(c)$ can be calculated from the formula $\Delta L(c) = TEC(c)L(c)\Delta T$ by an optional computer 16A or 16B associated with modulating signal generator 8A or 8B, respectively. The change in temperature is measured by conventional means (18A or 18B) and fed as an input to the computer 16A or 16B, respectively.

As a variation on the above application, the amplitude of the modulating signal 9 can be calculated by the computer 16 based upon the phase deviation in the output signal 20, as measured by an optional phase detector (17A or 17B), coupled to the computer (16A or 16B, respectively) and to the output modulated carrier 20. Such a phase deviation can be caused by thermal mechanical factors and/or instability of the carrier source 15.

The above description is included to illustrate the operation of the preferred embodiments and is not meant to limit the scope of the invention. The scope of the invention is to be limited only by the following claims. From the above discussion, many variations will be apparent to one skilled in the art that would yet be encompassed by the spirit and scope of the invention. For example, the FIG. 3 embodiment could be modified by applying a resistive heater to plunger 7C, to control its temperature and thus its length. Or, a temperature compensating element of the 7C variety can be inserted between housing 5 and a plunger of the 7A or 7B variety, to combine the advantages of temperature compensation with magnetostrictive or piezoelectric phase modulation.

What is claimed is:

1. A linear r.f. phase modulator comprising:
an r.f. sinusoidal carrier passing through a circulator having input, output, and isolated ports, said output port consisting solely of reflective, non-dissipative components;
fitting within an open end of the output port, a moving reflective surface coupled by a moving plunger to a housing fixedly mounted with respect to the circulator; and
means for generating a modulating signal; wherein the modulating signal is applied to the plunger;
the position of the reflective surface within the output port is a linear function of the amplitude of the modulating signal; and
movement of the reflective surface changes the path length of the r.f. carrier within the circulator, thereby linearly phase modulating said carrier, which exits the isolated port substantially unattenuated.

2. The phase modulator of claim 1 wherein the plunger is fabricated of a magnetostrictive material, and the modulating signal causes a change in the amplitude of a magnetic field applied to the plunger.

3. The phase modulator of claim 2 wherein the modulating signal is fed to a coil wrapped around the plunger.

4. The phase modulator of claim 1 wherein the plunger is fabricated of a piezoelectric material, and the modulating signal causes a change in the amplitude of an electric field applied to the plunger.

5. The phase modulator of claim 4 wherein the modulating signal is fed to a pair of electrodes sandwiched around the plunger.

6. The phase modulator of claim 1 wherein the plunger is fabricated of a thermally expansive material whose thermal expansion coefficient is preselected to compensate for phase shifts in a preselected path of the r.f. carrier through the circulator; and the modulating signal comprises a change in the ambient temperature surrounding the plunger.

7. The phase modulator of claim 1 further comprising a computer coupled to the modulating signal generating means; wherein the amplitude of the modulating signal is determined by the computer based upon the amount of phase shift desired to be imparted to the carrier by the moving reflective surface.

8. The phase modulator of claim 7 further comprising temperature sensing means coupled to the computer; wherein the computer calculates the amplitude of the modulating signal necessary to temperature compensate for a preselected compensation path passing through the circulator, based upon the chane in temperature as sensed by the temperature sensing means, the length of the compensation path, and the thermal expansion coefficients of the materials surrounding the compensation path.

9. The phase modulator of claim 7 further comprising phase detecting means coupled to the computer for detecting the phase deviation, if any, in the phase modulated r.f. carrier; wherein the computer calculates the amplitude of the modulating signal necessary to compensate for said phase deviation.

10. The phase modulator of claim 1 wherein a thermally expansive material, having a thermal expansion coefficient preselected to compensate for phase shifts in a preselected path of the r.f. carrier through the circulator, is inserted between the housing and the plunger; and the plunger is fabricated from a material from the class of materials comprising magnetostrictive and piezoelectric materials.

* * * * *

UNITED STATES PATENT AND TRADEMARK OFFICE
CERTIFICATE OF CORRECTION

PATENT NO. : 4,710,733

DATED : December 1, 1987

INVENTOR(S) : Phil ip D. Crill, Michael D. Rubin

It is certified that error appears in the above-identified patent and that said Letters Patent are hereby corrected as shown below:

In Col. 5, line 4, delete "chane" and insert in place thereof --change--

Signed and Sealed this

Third Day of May, 1988

Attest:

DONALD J. QUIGG

Attesting Officer

Commissioner of Patents and Trademarks